United States Patent
Yang et al.

(10) Patent No.: US 11,792,914 B2
(45) Date of Patent: Oct. 17, 2023

(54) CIRCUIT BOARD ASSEMBLY AND MANUFACTURING METHOD THEREOF

(71) Applicants: Avary Holding (Shenzhen) Co., Ltd., Shenzhen (CN); HongQiSheng Precision Electronics (QinHuangdao) Co., Ltd., Hebei Province (CN); Garuda Technology Co., Ltd., New Taipei (TW)

(72) Inventors: Zhi-Hong Yang, Guangzhou (CN); Mao-Feng Hsu, Taoyuan (TW)

(73) Assignees: AVARY HOLDING (SHENZHEN) CO., LTD., Shenzhen (CN); HONGQISHENG PRECISION ELECTRONICS (QINHUANGDAO) CO., LTD., Qinhuangdao (CN); GARUDA TECHNOLOGY CO., LTD., New Taipei (TW)

( * ) Notice: Subject to any disclaimer, the term of this patent is extended or adjusted under 35 U.S.C. 154(b) by 44 days.

(21) Appl. No.: 17/564,995

(22) Filed: Dec. 29, 2021

(65) Prior Publication Data

US 2023/0171876 A1 Jun. 1, 2023

(30) Foreign Application Priority Data

Nov. 30, 2021 (CN) .......................... 202111439457.9

(51) Int. Cl.
*H05K 1/02* (2006.01)
*H05K 3/46* (2006.01)
*H01L 23/552* (2006.01)

(52) U.S. Cl.
CPC ......... *H05K 1/0218* (2013.01); *H01L 23/552* (2013.01); *H05K 3/4644* (2013.01)

(58) Field of Classification Search
CPC ... H05K 3/4644; H05K 1/0218; H01L 23/552
USPC ......................................................... 174/255
See application file for complete search history.

(56) References Cited

FOREIGN PATENT DOCUMENTS

| CN | 209627788 U | 11/2019 |
|---|---|---|
| JP | 5861260 B2 | 2/2016 |
| KR | 100879375 B1 | 1/2009 |
| TW | M418509 U | 12/2011 |
| TW | 201417222 A | 5/2014 |
| TW | 201542053 A | 11/2015 |

*Primary Examiner* — Tremesha S Willis
(74) *Attorney, Agent, or Firm* — MUNCY, GEISSLER, OLDS & LOWE, P.C.

(57) ABSTRACT

The disclosure provides a circuit board assembly, which includes a core layer, an electronic component, a first shielding ring wall, a second shielding ring wall, a first circuit layer, a second circuit layer, a first insulating layer and first shielding columns. The core layer includes an accommodating space, and the accommodating space has an inner side wall. The first shielding ring wall is disposed in the accommodating space and covers the inner side wall, in which the first shielding ring wall surrounds the electronic component. The second shielding ring wall is disposed in the core layer and surrounds the first shielding ring wall. The core layer is disposed between the first circuit layer and the second circuit layer. The second circuit layer is disposed between the first insulating layer and the core layer. The first shielding columns are disposed in the first insulating layer.

15 Claims, 18 Drawing Sheets

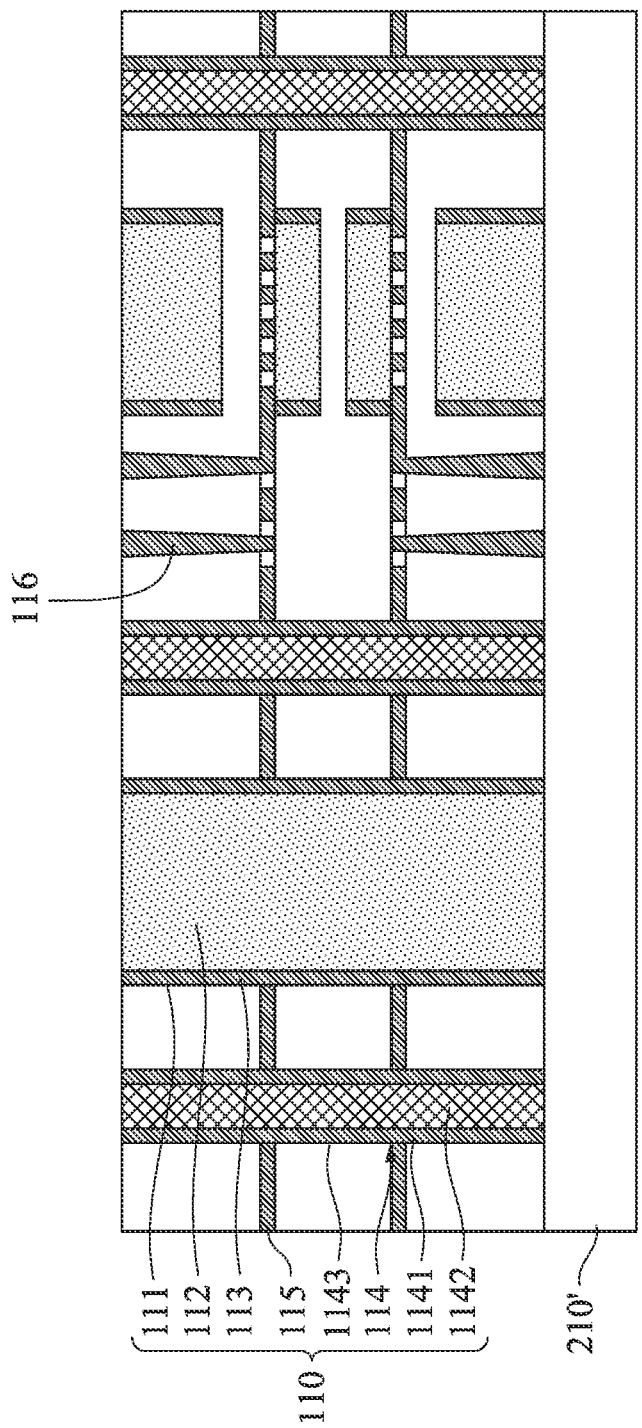

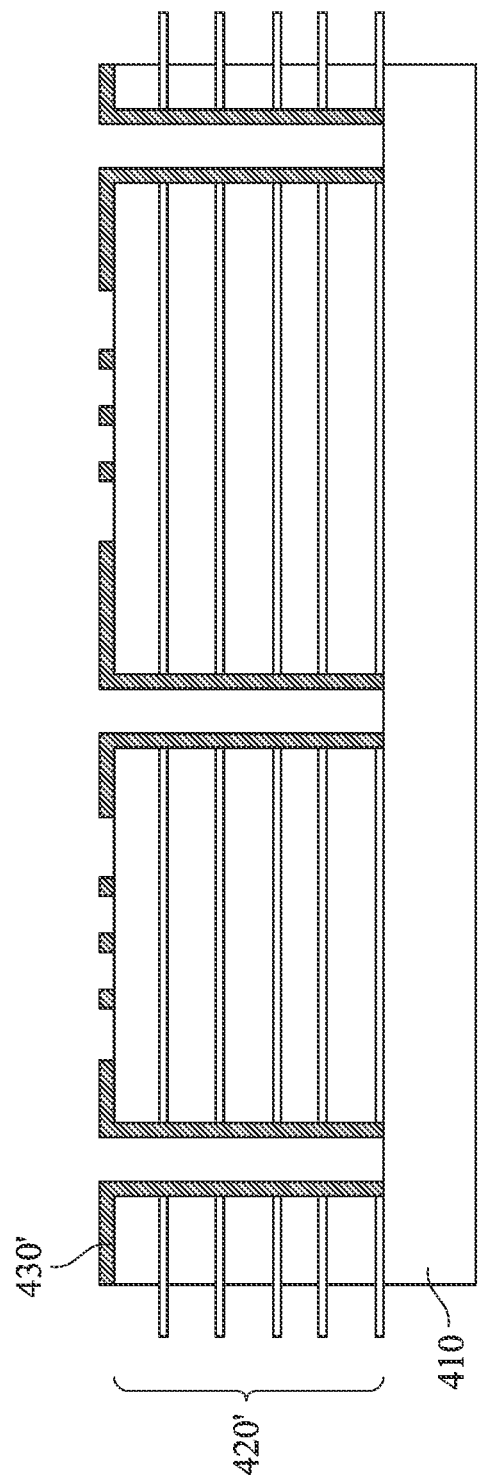

CIRCUIT BOARD ASSEMBLY AND MANUFACTURING METHOD THEREOF

CROSS-REFERENCE TO RELATED APPLICATION

This application claims priority to China Application Serial Number 202111439457.9, filed on Nov. 30, 2021, which is herein incorporated by reference.

BACKGROUND

Field of Invention

The present disclosure relates to a circuit board assembly and a manufacturing method thereof, in particular to a circuit board assembly and a manufacturing method thereof that can effectively shield electromagnetic interference between electronic components.

Description of Related Art

A current chip package, such as System in a Package (SiP), includes a plurality of electronic components. These electronic components generate electromagnetic waves when they are in operation, and the electromagnetic waves interfere with these electronic components, thereby affecting the operation of these electronic components, so that an electronic device equipped with this chip package, such as a smartphone or a tablet, may operate abnormally or even malfunction. Therefore, reducing or avoiding the interference of the electromagnetic waves on the electronic components in the chip package is an issue worthy of discussion.

SUMMARY

A purpose of the present disclosure is to provide a circuit board assembly, which includes a core layer, at least one electronic component, at least one first shielding ring wall, at least one second shielding ring wall, a first circuit layer, a second circuit layer, a first insulating layer and a plurality of first shielding columns. The core layer includes at least one accommodating space, and the accommodating space has an inner side wall. The electronic component is disposed in the accommodating space. The first shielding ring wall is disposed in the accommodating space and covers the inner side wall, in which the first shielding ring wall surrounds the electronic component. The second shielding ring wall is disposed in the core layer and surrounds the first shielding ring wall. The core layer is disposed between the first circuit layer and the second circuit layer. The second circuit layer is disposed between the first insulating layer and the core layer. The first shielding columns are disposed in the first insulating layer.

The present disclosure also provides a method of manufacturing a circuit board assembly, which includes providing a first substrate. A composite dielectric layer is formed over the first substrate, and the composite dielectric layer includes a plurality of sub-dielectric layers and a plurality of release films, in which each of the release films is disposed between adjacent two of the sub-dielectric layers. The composite dielectric layer is patterned to form a composite dielectric pattern layer, in which the composite dielectric pattern layer exposes a portion of the first substrate, and the composite dielectric pattern layer has a plurality of recesses. A plurality of metal layers are formed on the composite dielectric pattern layer, in which the metal layers cover an upper surface of the composite dielectric pattern layer and a plurality of sidewalls of the recesses. The composite dielectric pattern layer is separated to form a plurality of dielectric pattern layers, in which each of the dielectric pattern layers has a plurality of openings. The dielectric pattern layers are stacked over a second substrate to form a core layer over the second substrate, in which the openings of the dielectric pattern layers form a plurality of accommodating spaces and at least one groove. At least one electronic component is disposed in at least one of the accommodating spaces. The second substrate is removed after disposing the electronic component in the at least one of the accommodating spaces. At least one circuit layer is formed on the core layer. At least one insulating layer is formed on the circuit layer. A plurality of shielding columns are formed in the insulating layer.

In some embodiments, during disposing the at least one electronic component in the accommodating space, at least one conductive material is filled in the groove, in which the at least one conductive material protrudes from the groove.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A to 2I are schematic cross-sectional views of a method of manufacturing a circuit board assembly at various process stages according to some embodiments of the present disclosure.

FIGS. 4A to 4E are schematic cross-sectional views of a method of manufacturing a circuit board assembly at various process stages according to other embodiments of the present disclosure.

DETAILED DESCRIPTION

Figure 1A:
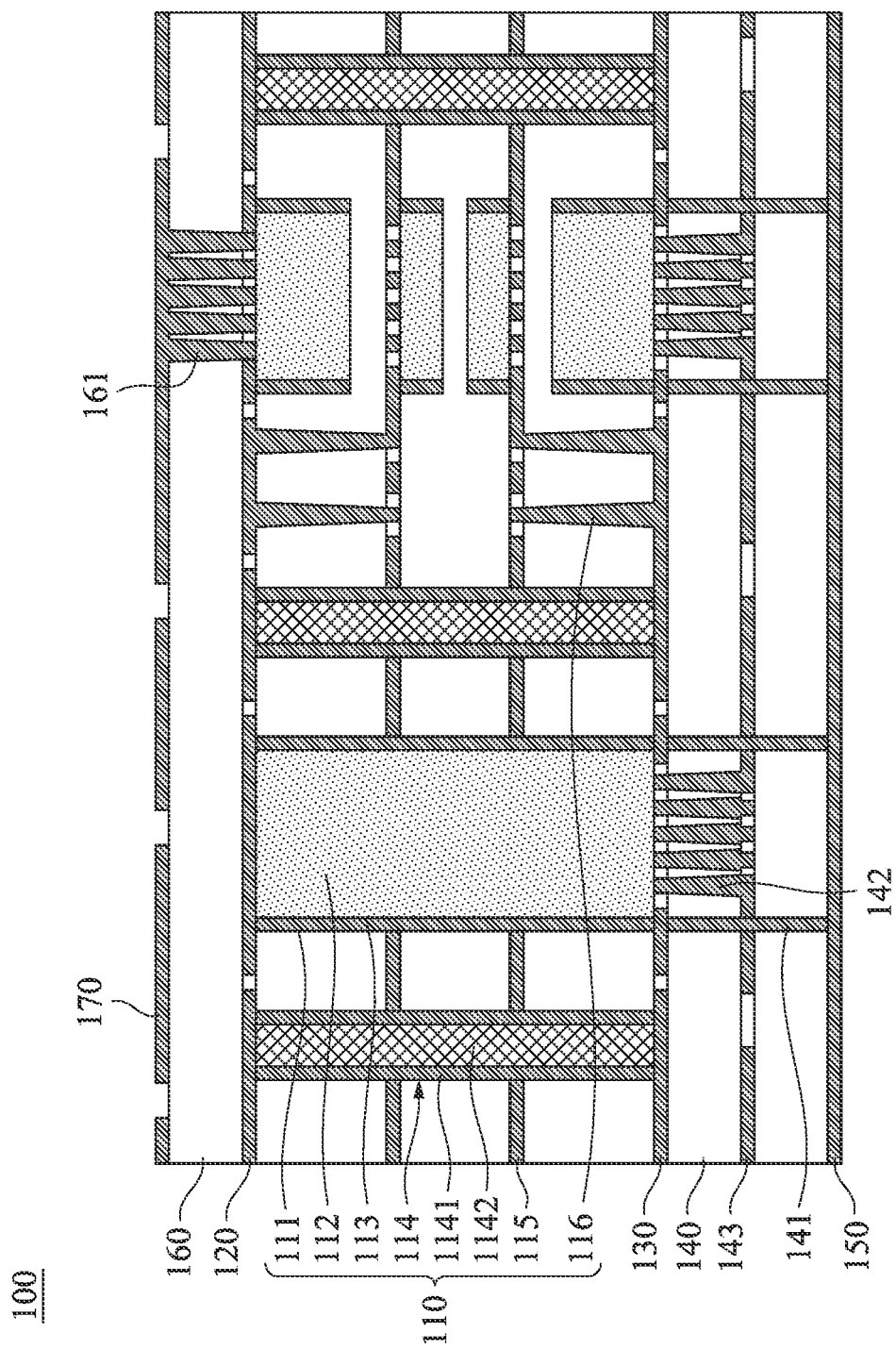
FIG. 1A is a schematic cross-sectional view of a circuit board assembly according to some embodiments of the present disclosure.

The following disclosure provides many different embodiments or examples, for implementing different features of the provided subject matter. Specific examples of elements, values, operations, materials, configurations and the like are described below to simplify the present disclosure. These are, of course, merely examples and are not intended to be limiting. Other elements, values, operations, materials, configurations and the like are also considered. For example, in the following description, forming a first feature over a second feature may include an embodiment in which the first and second features are formed in direct contact, and may also include an embodiment in which additional features may be formed between the first and second features, such that the first and second features may not be in direct contact. In addition, the present disclosure may repeat reference numerals and/or letters in the various examples. This repetition does not indicate a relationship between the various embodiments and/or configurations discussed.

In addition, spatially relative terms, such as "beneath", "below", "lower", "over", "higher", etc. may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative description used herein may likewise be interpreted accordingly.

Generally, the circuit board assembly of the present disclosure can be used in any electronic product or electronic device, and various components with radio frequency, digitals, or/and optoelectronics, etc., for example, are formed into a highly integrated circuit board assembly by using system in a package (SIP), so as to avoid electromagnetic wave leakage or interference between the various components.

First, please refer to FIG. 1A. FIG. 1A is a schematic cross-sectional view of a circuit board assembly according to some embodiments of the present disclosure. In some embodiments of the present disclosure, the circuit board assembly 100 includes a core layer 110, at least one electronic component 112, at least one first shielding ring wall 113, at least one second shielding ring wall 114, a first circuit layer 120, a second circuit layer 130, a first insulating layer 140 and a plurality of first shielding columns 141.

The core layer 110 has at least one accommodating space 111, in which the accommodating space 111 has an inner side wall (not labeled). The electronic component 112 is disposed in the accommodating space 111. The first shielding ring wall 113 is disposed in the accommodating space 111 and covers the inner side wall, in which the first shielding ring wall 113 surrounds the electronic component 112. The second shielding ring wall 114 is disposed in the core layer 110 and surrounds the first shielding ring wall 113. A material of the core layer 110 is a non-photosensitive dielectric material and may include ABF (ajinomoto build-up film), polyimide (PI), PP (prepreg), or a combination thereof.

In this embodiment, a plurality of electronic components 112 are disposed in the core layer 110, and each of the electronic components 112 is surrounded by the corresponding first shielding ring wall 113. It is noted that in other embodiments, only one electronic component 112 may be provided in the core layer 110. Hence, five electronic components 112 and five first shielding ring walls 113 shown in FIG. 1A are for illustration only, and a number of the electronic components 112 and a number of the first shielding ring walls 113 are not limited.

The first shielding ring wall 113 can preliminarily shield or block the electromagnetic waves leaking from the electronic component 112 so as to remove most of the electromagnetic wave interference. The electronic component 112 may be a chip, which may be a die that has not been packaged or a chip that has been packaged. When the electronic component 112 is the aforementioned die, the circuit board assembly 100 may be a chip package. The first shielding ring wall 113 has conductivity, and a material of the first shielding ring wall 113 includes copper, gold, silver, nickel, other metal materials, or alloys.

Figure 1B:
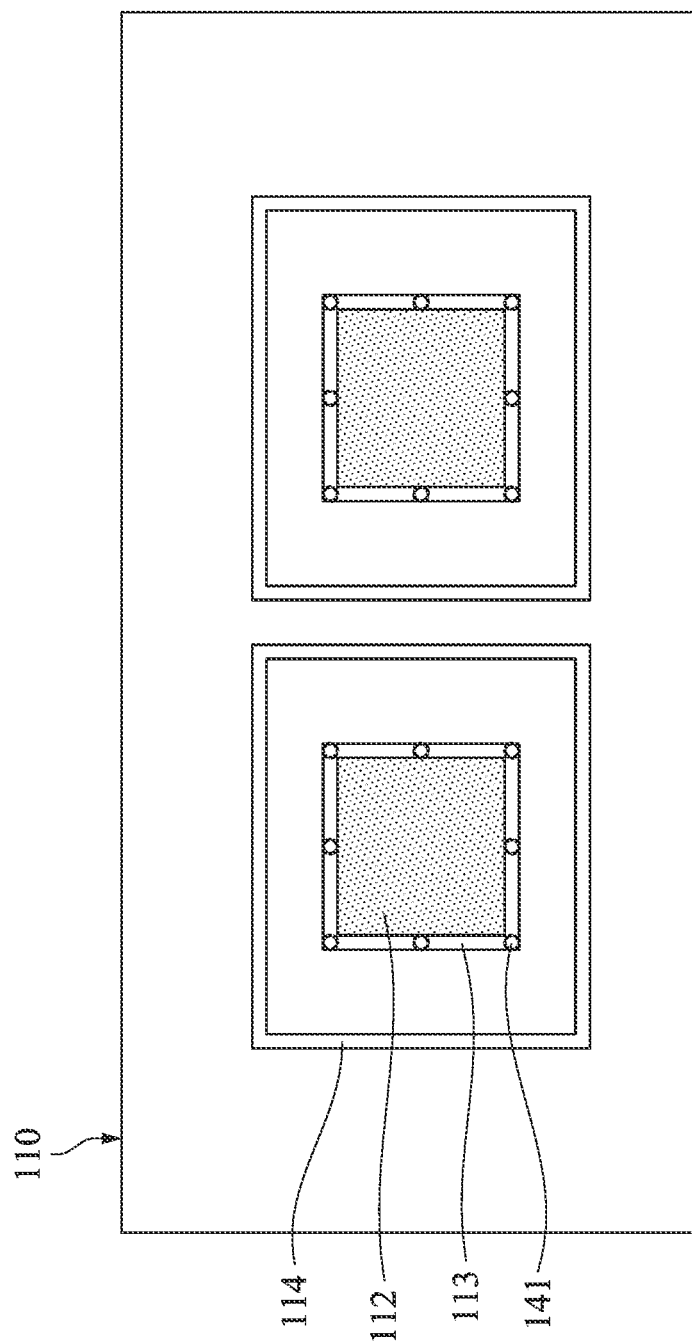
FIG. 1B is a schematic top view of a core layer, an electronic component, a first shielding ring wall, a second shielding ring wall, and first shielding columns according to FIG. 1A.

Please refer to FIG. 1B. FIG. 1B is a schematic top view of the core layer, the electronic component, the first shielding ring wall, the second shielding ring wall, and the first shielding columns according to FIG. 1A. In some embodiments, the second shielding ring wall 114 is disposed in the core layer 110 and surrounds the first shielding ring wall 113. It can be clearly seen from FIG. 1B that the second shielding ring wall 114 is not directly in contact with the first shielding ring wall 113, while the second shielding ring wall 114 and the first shielding ring wall 113 are substantially concentrically disposed.

Please refer to FIGS. 1A and 1B. In some embodiments, the second shielding ring wall 114 includes two metal layers 1141 and a conductive material 1142. The two metal layers 1141 are arranged in concentric rings, and one of the metal layers 1141 surrounds the other of the metal layers 1141 and the conductive material 1142. Specifically, two ends of the second shielding ring wall 114 extend to upper and lower surfaces of the core layer 110. The second shielding ring wall 114 can shield or block electromagnetic waves leaking due to gap differences when there is a size difference between the second shielding ring wall 114 and the electronic components 112. Specifically, the gap differences are caused by the portions of vertical embedded components on which copper is not deposited or plated. Moreover, for a circuit board, the numbers and types of the embedded components in each position are different, and the gap differences are also different, but each of the gap differences is less than the overall thickness of the circuit board.

As such, with the arrangement of the first shielding ring wall 113, most of the electromagnetic waves leaking from the electronic component 112 will be shielded. Moreover, the metal layers 1141 in the second shielding ring wall 114 can increase rigidity of the circuit board assembly 100. In addition, materials of the metal layers 1141 and the conductive material 1142 of the second shielding ring wall 114 may include copper, gold, silver, nickel, other metal materials, or alloys.

The core layer 110 is disposed between the first circuit layer 120 and the second circuit layer 130, in which the second circuit layer 130 is disposed between the first insulating layer 140 and the core layer 110, and the first shielding column 141 is disposed in the first insulating layer 140. In addition, a plurality of conductive columns 142 are disposed in the first insulating layer 140 and electrically connected to the electronic element 112. The first shielding column 141 is electrically connected to the first shielding ring wall 113 and extends to upper and lower surfaces of the first insulating layer 140. The first shielding columns 141 surrounds the conductive columns 142 and can be arranged along the first shielding ring wall 113.

When the conductive columns 142 located beneath the electronic component 112 have currents flowing, and an electromagnetic field is generated, the first shielding column 141 can shield the electromagnetic field. The first shielding columns 141 may be arranged in columns around the conductive columns 142, so that the conductive columns 142 will not affect flow of the circuit. In addition, a material of the first shielding column 141 may include copper, gold, silver, nickel, other metal materials, or alloys.

In some embodiments, the electronic component 112 is electrically isolated from the first shielding ring wall 113, the second shielding ring wall 114, and the first shielding columns 141. As such, the first shielding ring wall 113, the second shielding ring wall 114, and the first shielding columns 141 will not affect the operation of the electronic component 112.

In some embodiments, the circuit board assembly 100 further includes a shielding layer 150, in which the shielding layer 150 is disposed beneath the first insulating layer 140, and the first insulating layer 140 is disposed between the shielding layer 150 and the core layer 110, and the first shielding column 141 extends to the core layer 110 and the shielding layer 150. Specifically, the shielding layer 150 is disposed on a surface of the first insulating layer 140 opposite to the core layer 110 to enhance the shielding performance of the electromagnetic field.

Please refer to FIG. 1A, a surface of the electronic component 112, one end of the second shielding ring wall 114 and a surface of the core layer 110 are coplanar. Specifically, the second shielding ring wall 114 extends to the upper and lower surfaces of the core layer 110, so that the electromagnetic waves leaking from the electronic component 112 can be completely shielded due to the gap difference. In the embodiment shown in FIG. 1A, the surfaces of some electronic components 112 on the right are coplanar with the one end of the second shielding ring wall 114 and the surface of the core layer 110, but the surfaces of other electronic components 112 are not coplanar with the one end of the second shielding ring wall 114 and the surface of the core layer 110, and may not be in contact with the surface of the core layer 110.

In addition, the circuit board assembly 100 may further include a second insulating layer 160, a wiring layer 170, and a plurality of conductive columns 161, while the first circuit layer 120 is disposed between the second insulating layer 160 and the core layer 110. The wiring layer 170 is disposed on the second insulating layer 160, and the conductive columns 161 extend to the core layer 110 and the wiring layer 170.

It is noted that a manufacturing method and a process of the circuit board assembly 100 shown in FIG. 1A will be detailed in subsequent paragraphs, and the following will describe another embodiment of a circuit board assembly 300 (FIG. 3A) of the present disclosure.

Figure 3A:
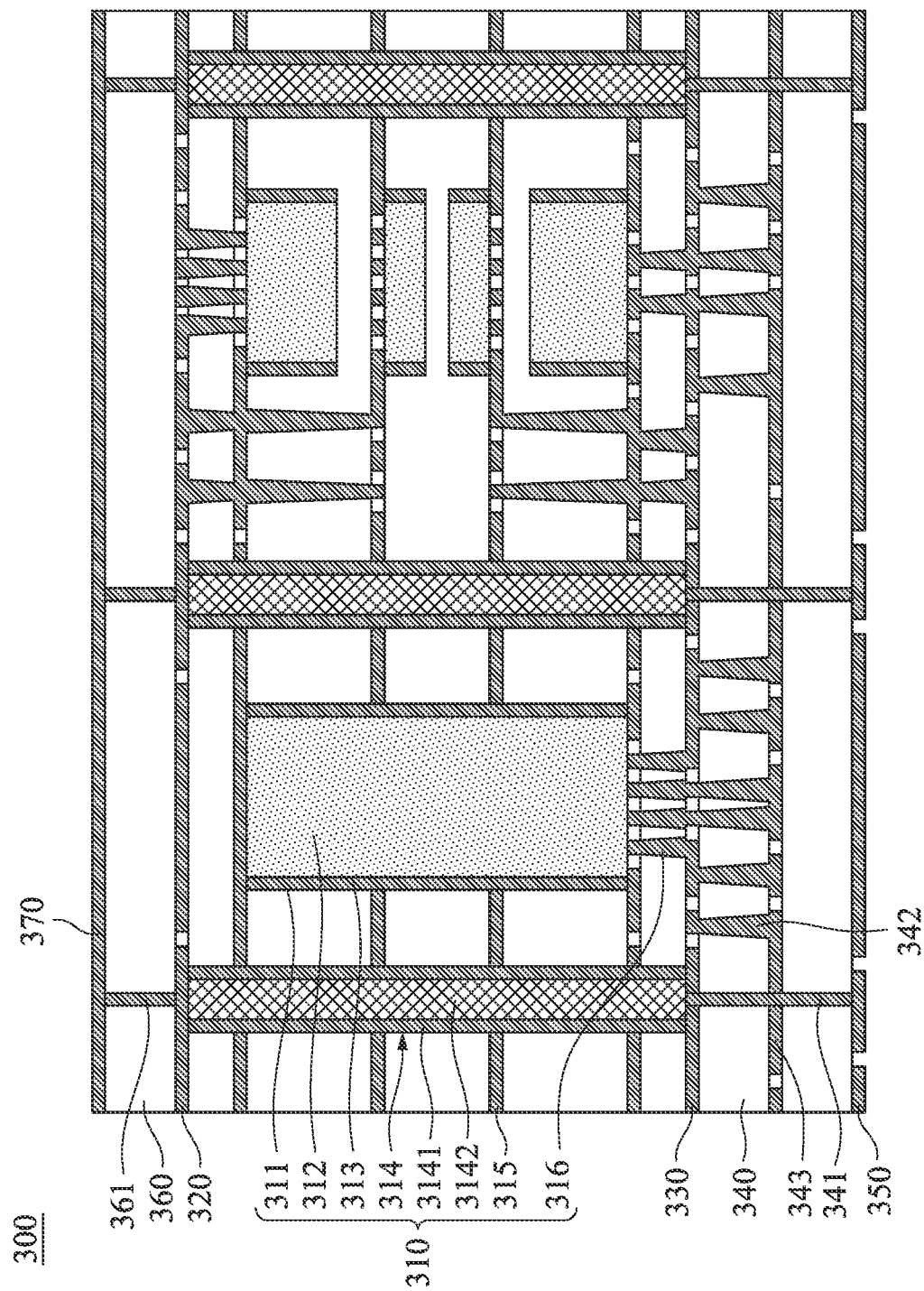
FIG. 3A is a schematic cross-sectional view of a circuit board assembly according to other embodiments of the present disclosure.

Please refer to FIG. 3A. FIG. 3A is a schematic cross-sectional view of a circuit board assembly according to other embodiments of the present disclosure. The circuit board assembly 300 shown in FIG. 3A is similar to the aforementioned circuit board assembly 100, and the following mainly describes different features between the circuit board assemblies 100 and 300. Basically, the same features of the circuit board assemblies 100 and 300 will not be repeated.

The circuit board assembly 300 shown in FIG. 3A includes a core layer 310, at least one electronic component 312, at least one first shielding ring wall 313, at least one second shielding ring wall 314, a first circuit layer 320, a second circuit layer 330, a first insulating layer 340 and a plurality of first shielding columns 341. The core layer 310 has at least one accommodating space 311, in which the accommodating space 311 has an inner side wall (not labeled). The electronic component 312 is disposed in the accommodating space 311. The first shielding ring wall 313 is disposed in the accommodating space 311 and covers the inner side wall, in which the first shielding ring wall 313 surrounds the electronic component 312. The second shielding ring wall 314 is disposed in the core layer 310 and surrounds the first shielding ring wall 313.

Figure 3B:
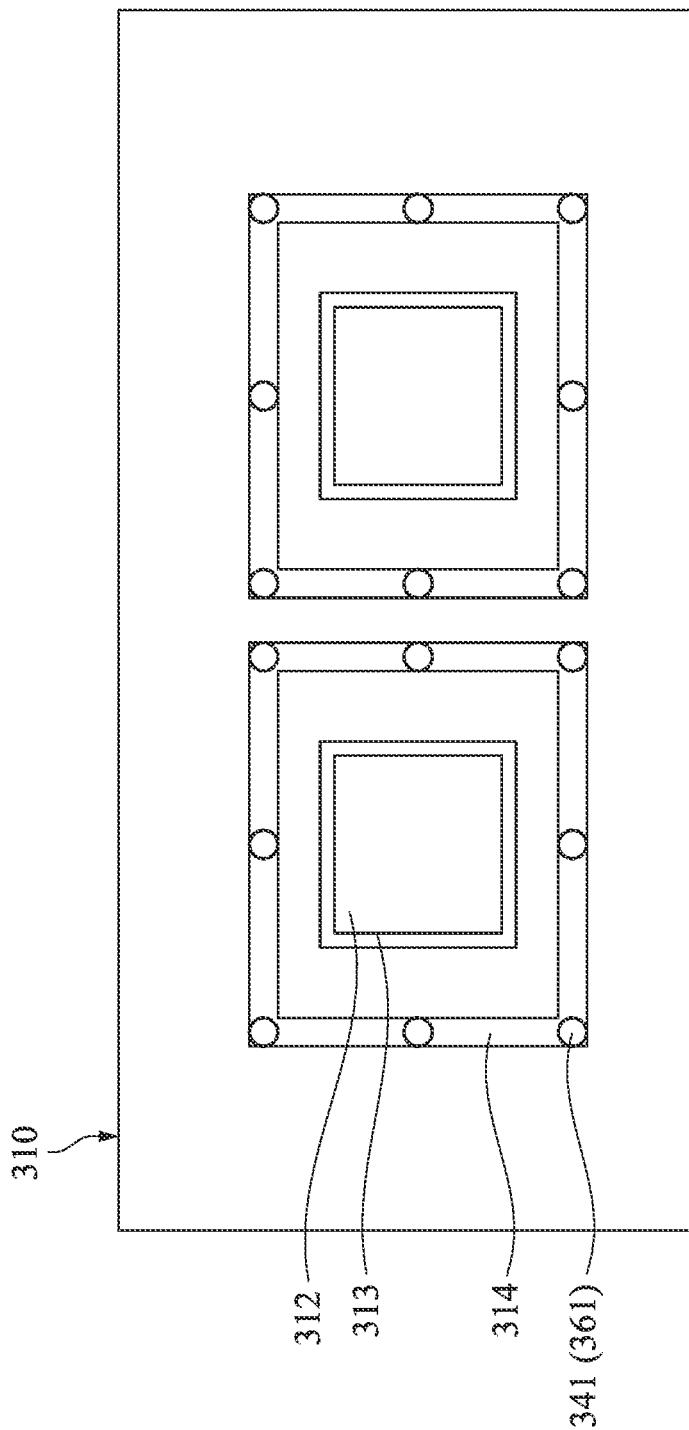
FIG. 3B is a schematic top view of a core layer, an electronic component, a first shielding ring wall, a second shielding ring wall, a first shielding column, and a second shielding column according to FIG. 3A.

Please refer to FIG. 3B first. FIG. 3B is a schematic top view of the core layer, the electronic component, the first shielding ring wall, the second shielding ring wall, the first shielding column, and the second shielding column according to FIG. 3A. In some embodiments, the second shielding ring wall 314 is disposed in the core layer 310 and surrounds the first shielding ring wall 313. It can be clearly seen from FIG. 3B that the second shielding ring wall 314 is not directly in contact with the first shielding ring wall 313, and the second shielding ring wall 314 and the first shielding ring wall 313 are substantially concentrically disposed.

In some embodiments, the second shielding ring wall 314 includes two metal layers 3141 and a conductive material 3142. The two metal layers 3141 are arranged in concentric rings, and one of the metal layers 3141 surrounds the other of the metal layers 3141 and the conductive material 3142. Specifically, two ends of the second shielding ring wall 314 extend to upper and lower surfaces of the core layer 310. The second shielding ring wall 314 can shield or block electromagnetic waves leaking from the electronic components 312 when there is the size difference between the electronic components 312. As such, with the arrangement of the first shielding ring wall 313, most of the electromagnetic waves leaking from top, bottom, left, and right of the electronic component 312 can be shielded. In addition, the metal layers 3141 in the second shielding ring wall 314 can increase the rigidity of the circuit board assembly 300.

Similar to FIG. 1A, the upper and lower surfaces of the core layer 310 in FIG. 3A are respectively provided with the first circuit layer 320 and the second circuit layer 330, in which the second circuit layer 330 is disposed between the first insulating layer 340 and the core layer 310. The first shielding column 341 and the conductive columns 342 are provided in the first insulating layer 340. The conductive column 342 is electrically connected to the core layer 310. The difference from FIG. 1A is that the first shielding column 341 is electrically connected to the second shielding ring wall 314 and extends to upper and lower surfaces of the first insulating layer 340, in which the first shielding column 341 surrounds the conductive columns 342.

Referring to FIGS. 3A and 3B, the first shielding columns 341 are arranged along the second shielding ring wall 314. When the conductive columns 342 located beneath the core layer 310 have current flowing and an electromagnetic field is generated, the first shielding column 341 can shield the electromagnetic field generated by the current. In addition, the first shielding columns 341 are arranged in columns around the conductive columns 342, so that the conductive columns 342 will not affect flow of the circuit.

In some embodiments, the circuit board assembly 300 further includes a first shielding layer 350, in which the first shielding layer 350 is disposed beneath the first insulating layer 340, and the first insulating layer 340 is disposed between the first shielding layer 350 and the core layer 310, and the first shielding column 341 extends to the core layer 310 and the first shielding layer 350. Specifically, the first shielding layer 350 is disposed on a surface of the first insulating layer 340 opposite to the core layer 310 to enhance the shielding performance of the electromagnetic field.

The circuit board assembly 300 further includes a second insulating layer 360 and a second shielding column 361. The first circuit layer 320 is disposed between the second insulating layer 360 and the core layer 310. The second shielding column 361 is similar to the first shielding column 341, and the second shielding column 361 is also electrically connected to the second shielding ring wall 314, and the first shielding column 341 and the second shielding column 361 are arranged along the second shielding ring wall 314. Specifically, the second shielding ring wall 314 is disposed between the first shielding column 341 and the second shielding column 361. In one embodiment, a second shielding layer 370 is provided on the second insulating layer 360, and the second shielding column 361 extends to the core layer 310 and the second shielding layer 370.

The electronic component 312 is electrically isolated from the first shielding ring wall 313, the second shielding ring wall 314, the first shielding column 341, and the second shielding column 361. As such, the first shielding ring wall 313, the second shielding ring wall 314, the first shielding column 341, and the second shielding column 361 will not affect the operation of the electronic component 312.

A height of the second shielding ring wall 314 is greater than a thickness of the electronic component 312. Specifically, the second shielding ring wall 314 extends to the upper and lower surfaces of the core layer 310, so that the electromagnetic waves leaking from the electronic component 312 can be completely shielded. As shown in FIG. 3A, all the electronic components 312 are not in contact with the upper and lower surfaces of the core layer 310, and the two ends of the second shielding ring wall 314 are coplanar with the upper and lower surfaces of the core layer 310. In other words, the total thickness of all the electronic components 312 will be smaller than the height of the second shielding ring wall 314, and the second shielding ring wall 314 can completely shield the electromagnetic waves leaking from the electronic component 312 basically.

The flow of the manufacturing method of the circuit board assembly 100 of the embodiment shown in FIG. 1A will be described in detail below.

Figure 2A:
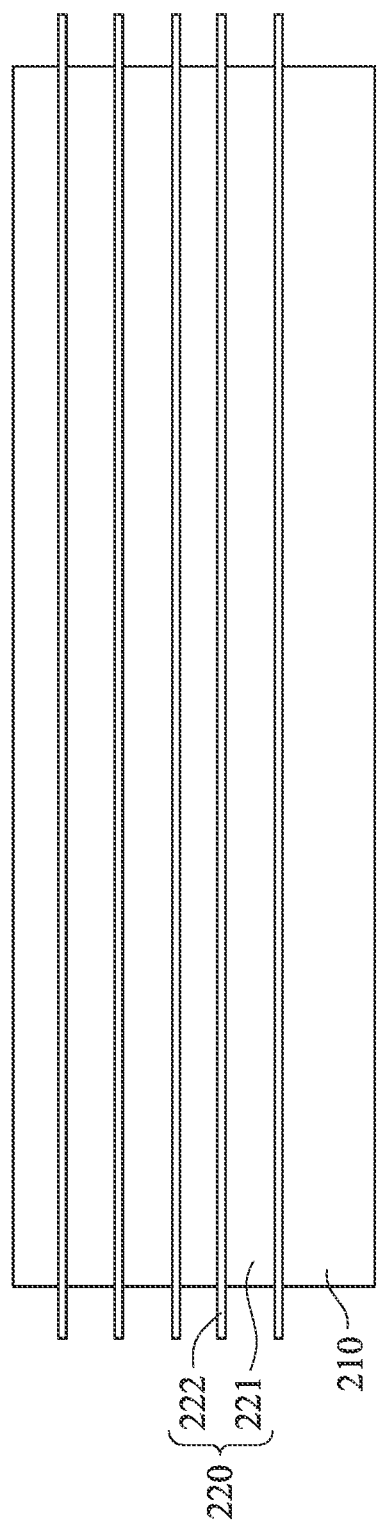

Please refer to FIGS. 2A to 2I. FIGS. 2A to 2I are schematic cross-sectional views of a method of manufacturing a circuit board assembly at various process stages according to some embodiments of the present disclosure. First, as shown in FIG. 2A, a first substrate 210 is provided, and a composite dielectric layer 220 is formed over the first substrate 210, and the composite dielectric layer 220 includes a plurality of sub-dielectric layers 221 and a plurality of release films 222. The release films 222 are disposed between two of the sub-dielectric layers 221 and between the composite dielectric layer 220 and the first substrate 210.

Specifically, the sub-dielectric layers 221 and the release films 222 are stacked alternately, and can be formed by using a deposition or coating process. In some embodiments, a thickness of each of the sub-dielectric layers 221 of the composite dielectric layer 220 can be different and can be adjusted according to a size of the electronic component. A material of each of the sub-dielectric layers 221 of the composite dielectric layer 220 may be a non-photosensitive dielectric material, such as ABF, polyimide, PP (prepreg), or a combination thereof.

Figure 2B:
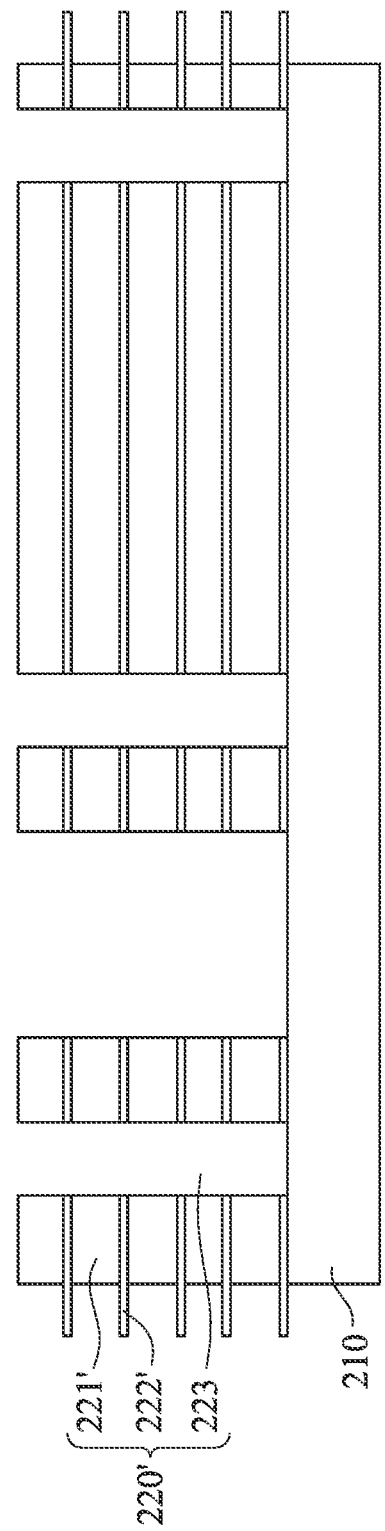

Please refer to FIG. 2B, a patterning process is performed on the composite dielectric layer 220 to form a composite dielectric pattern layer 220' exposing a portion of the first substrate 210, and the composite dielectric pattern layer 220' has a plurality of recesses 223. In some embodiments, the patterning process includes an etching process, an imprinting process or a cutting process. In some embodiments, the sub-dielectric layers 221 that have been alternately stacked with the release films 222 are cured before the patterning process, so that the patterned composite dielectric layer 220 has a flat sidewall. After the patterning process, a portion of an upper surface of the first substrate 210 is exposed, in which the recesses 223 are surrounded by the portion of the upper surface and sidewalls of the composite dielectric pattern layer 220'.

Figure 2C:
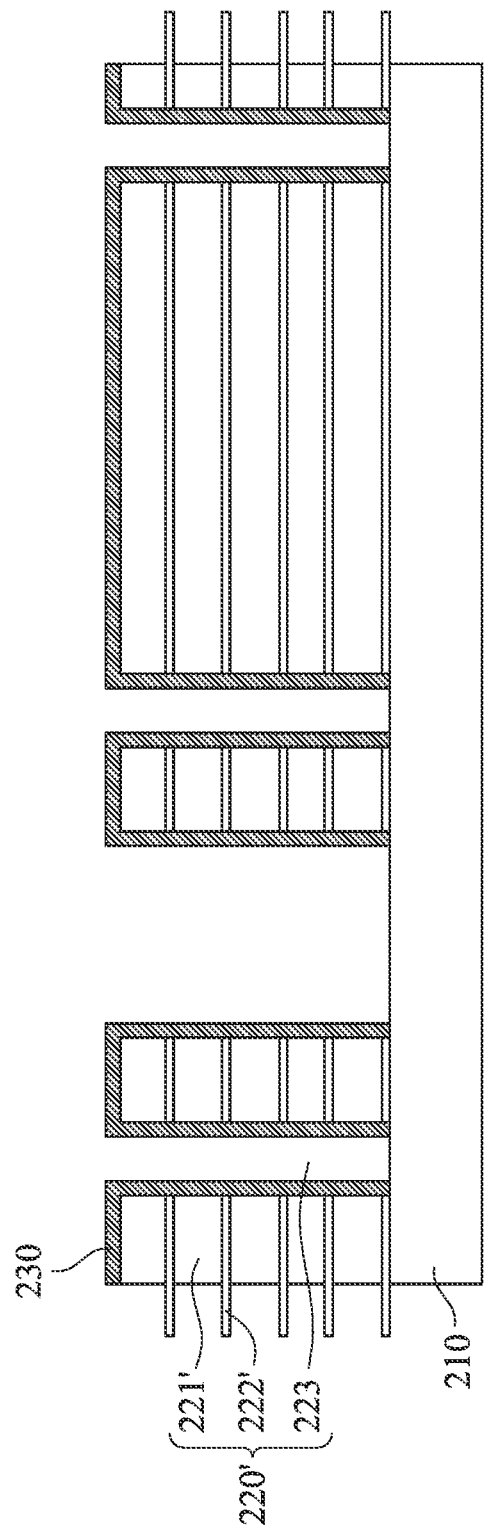

Next, please continue to refer to FIG. 2C, a plurality of metal layers 230 are formed on the composite dielectric pattern layer 220', and the metal layers 230 cover an upper surface of the composite dielectric pattern layer 220' and sidewalls of the recesses 223. It is noted that the metal layers 230 are not formed on the exposed upper surface of the first substrate 210 in this step. In some embodiments, the method of forming the metal layer 230 includes an electroplating process, a deposition process, or a combination thereof. In some embodiments, a material of the metal layers 230 includes copper, gold, silver, nickel, other metal materials, or alloys.

Figure 2D:
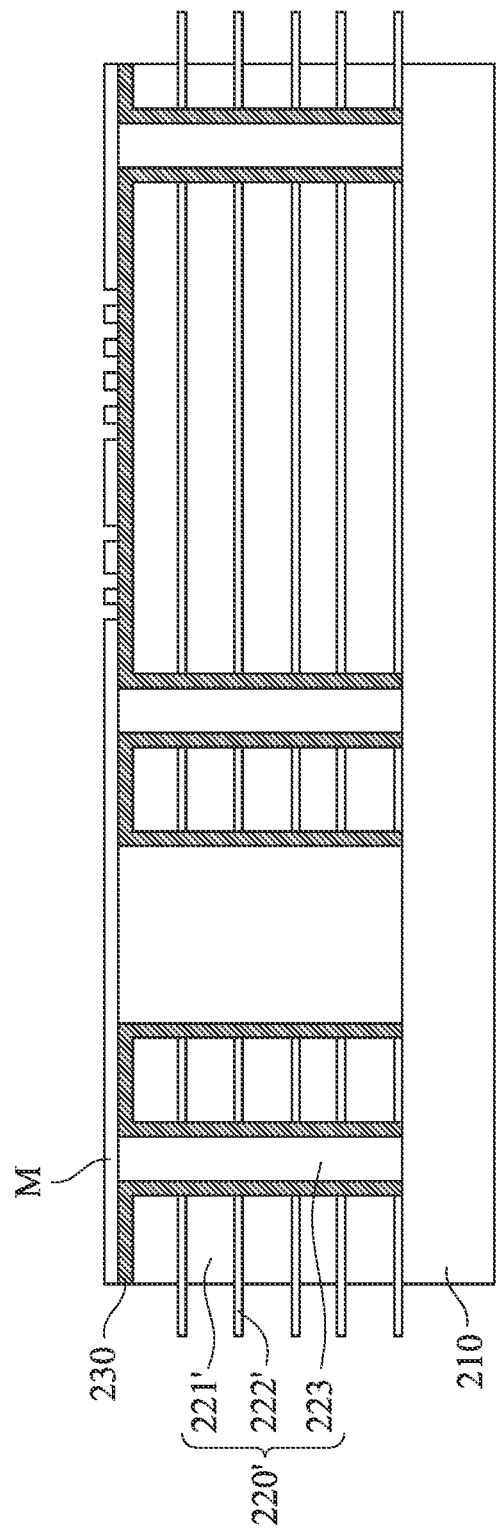
Figure 2E:
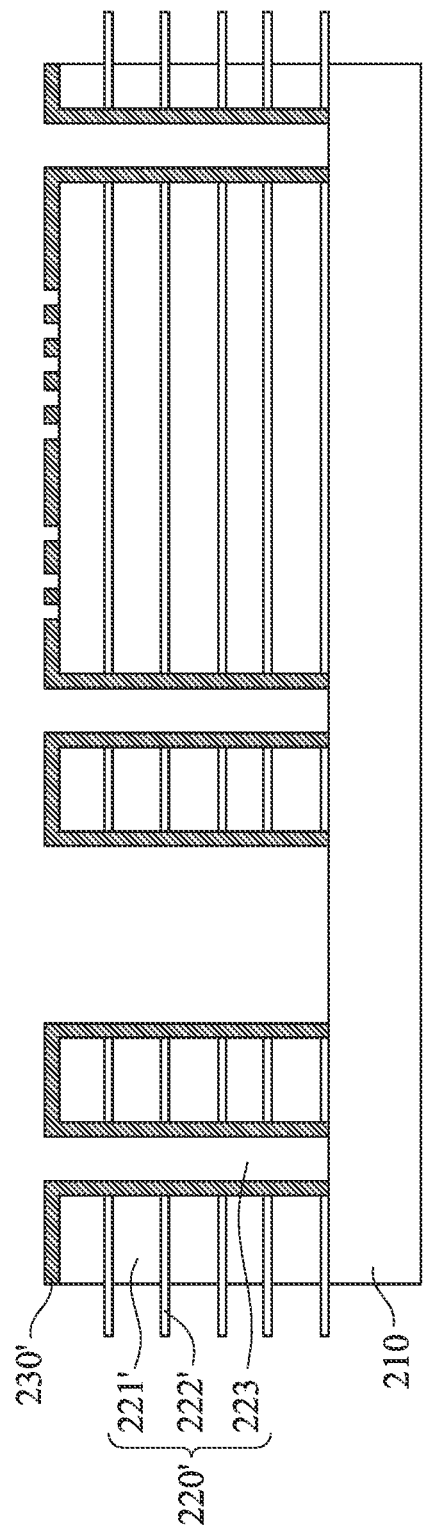

Referring to FIG. 2D and FIG. 2E, according to current flow requirements of the components in the circuit that is stacked in the subsequent steps, a mask M is provided on the metal layer 230. And, a patterning process is performed on the metal layers 230. The method of forming a patterned metal layer 230' includes an etching process. Accordingly, the patterned metal layer 230' as shown in FIG. 2E is formed.

Figure 2F:
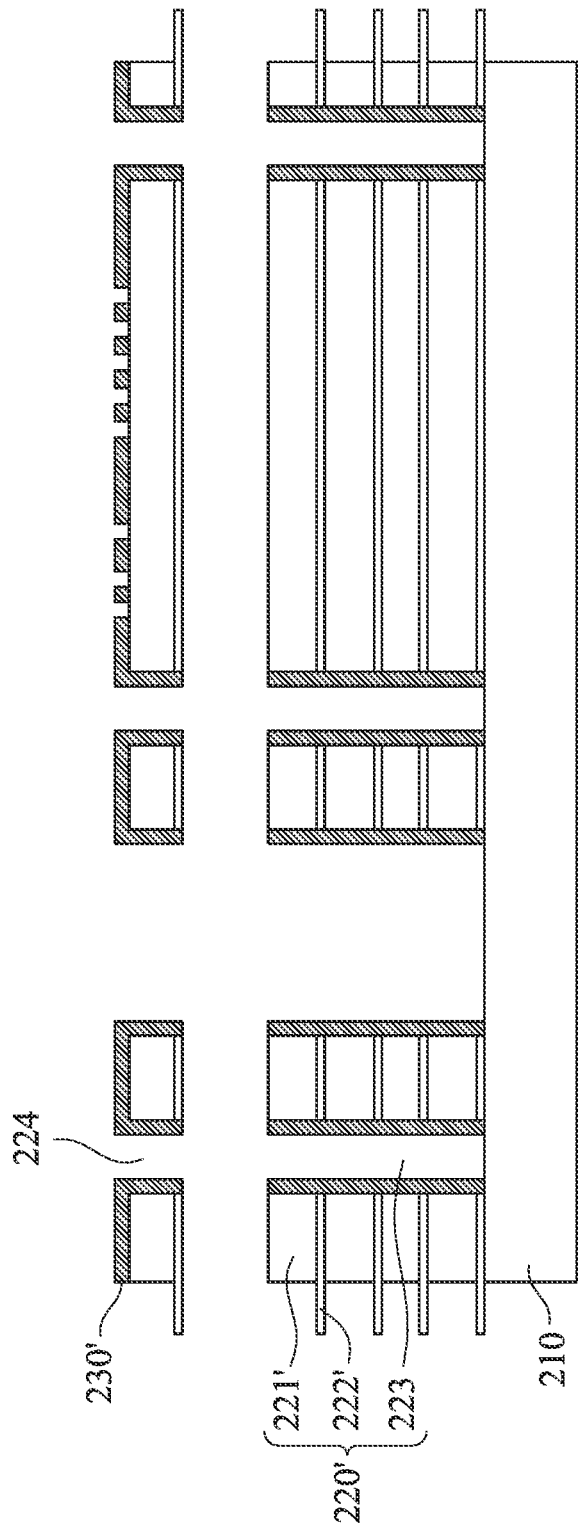

Next, referring to FIG. 2F, the composite dielectric pattern layer 220' is peeled layer by layer by the release film 222' to form a plurality of dielectric pattern layers 221', and each of the dielectric pattern layers 221' has a plurality of openings 224.

Figure 2G:
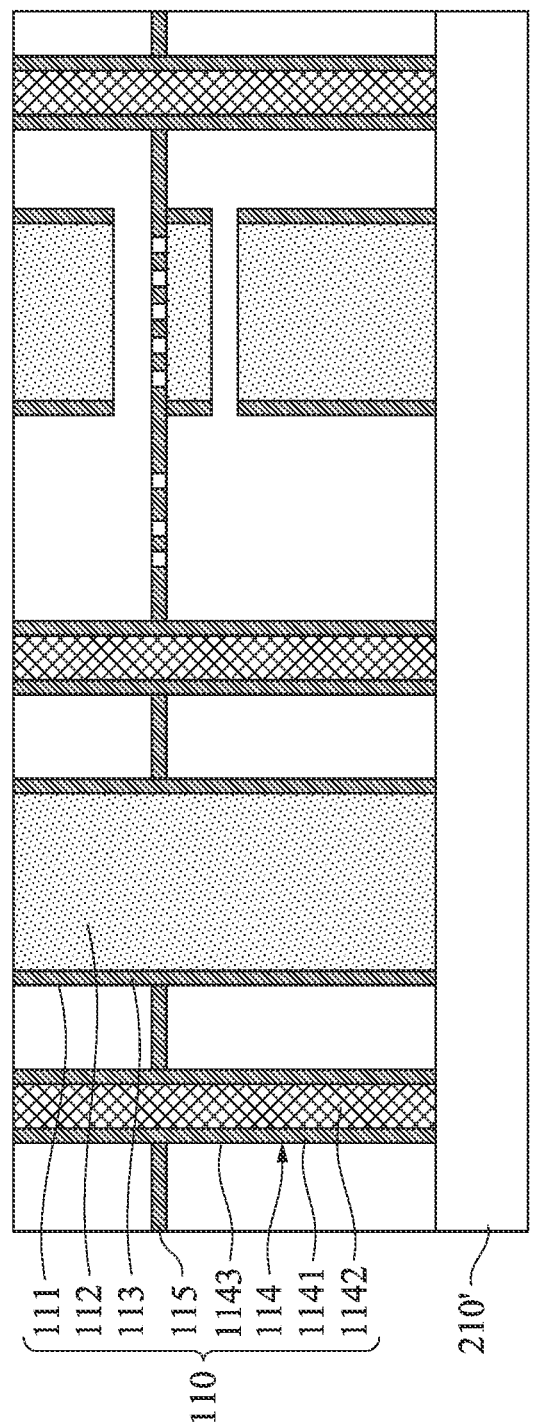

Referring to FIG. 2G and FIG. 2H, the dielectric pattern layers 221' are stacked on the second substrate 210', thus forming the core layer 110, in which the openings 224 in the dielectric pattern layers 221 form a plurality of accommodating spaces 111 and a groove 1143. In addition, a release film (not shown) may be provided between the core layer 110 and the second substrate 210'. The groove 1143 surrounds the accommodating space 111, that is, each of the accommodating spaces 111 has the corresponding groove 1143 surrounding it.

When the dielectric pattern layers 221' are stacked, an epoxy-based adhesive or an acrylic resin-based adhesive may be used to adhere the dielectric pattern layers 221' to each other to achieve attachment. After the composite dielectric pattern layer 220' is separated and before the dielectric pattern layers 221' are stacked over the second substrate 210', a plurality of metal layers 115 may be formed in the dielectric pattern layers 221'. The above steps are to stack the dielectric pattern layers 221' to fan out a wiring pattern (metal layers 115) in the core layer 110. In one embodiment, the method of forming the metal layer 115 may include an electroplating process, a deposition process, or a combination thereof. The method of forming the conductive column 116 may include a drilling process and a deposition process. A material of each of the metal layer 115 and the conductive column 116 includes copper, gold, silver, nickel, other metal materials, or alloys.

Please continue to refer to FIGS. 2G and 2H. During disposing the electronic component 112 in the accommodating space 111, a conductive material 1142 is filled in the groove 1143, and the filled conductive material 1142 slightly protrudes from the groove 1143. Specifically, after the dielectric pattern layer 221' is stacked over the second substrate 210', the conductive material 1142 is filled, and the conductive material 1142 slightly protrudes from the groove 1143. As such, when the dielectric pattern layer 221' is stacked again and the conductive material 1142 is filled, the conductive material 1142 filled before and after can be joined, and the structure of the core layer 110 can be stable. Accordingly, the three steps of disposing the electronic component 112, stacking the dielectric pattern layer 221', and filling the conductive material 1142 can be performed repeatedly.

Figure 2I:
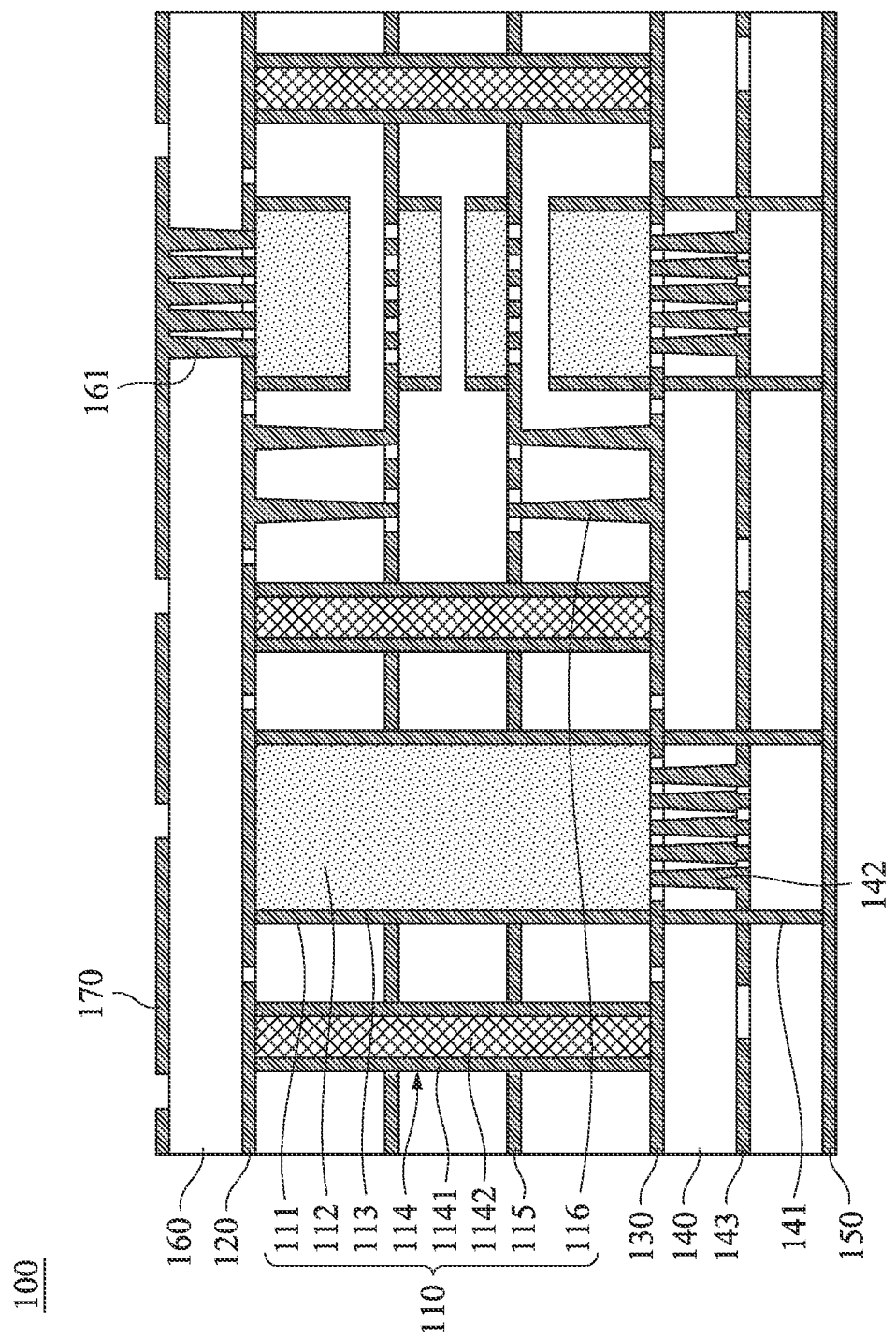

Referring to FIG. 2I, after the core layer 110 formed in FIG. 2H is peeled off from the second substrate 210', a first circuit layer 120 and a second circuit layer 130 are formed, and the core layer 110 is located between the first circuit layer 120 and the second circuit layer 130. Next, a first insulating layer 140 is formed on the second circuit layer 130, and a second insulating layer 160 is formed on the first circuit layer 120. A plurality of first shielding columns 141 are also formed in the first insulating layer 140, and the first shielding columns 141 are electrically connected to the metal layer 230 surrounding the electronic component 112 (i.e., the first shielding ring wall 113). In some embodiments, the method of forming the first shielding column 141 may include a drilling process and a deposition process.

In some embodiments, the aforementioned three steps of disposing the electronic component 112, stacking the dielectric pattern layer 221', and filling the conductive material 1142 are performed in a working environment with a temperature in a range from 25° C. to 180° C. As such, it can be ensured that the formed core layer 110 will not be deformed due to overheating.

Still referring to FIG. 2I, a plurality of conductive columns 142 and 161 are also formed in the first insulating layer 140 and the second insulating layer 160, and the conductive columns 142 and 161 are electrically connected to different electronic components 112. The method of forming the conductive columns 142 and 161 may include a drilling process and a deposition process. In some embodiments, a shielding layer 150 is formed on the first insulating layer 140, whereas a wiring layer 170 is formed on the second insulating layer 160. The method of forming the shielding layer 150 and the wiring layer 170 includes a deposition process, an electroplating process, or a combination thereof. As such, the circuit board assembly 100 shown in FIG. 1A of the present disclosure is formed, which can basically completely shield the electromagnetic waves emitted from the electronic component.

The flow of the manufacturing method of the circuit board assembly 300 of the embodiment shown in FIG. 3A will be described in detail below.

Please refer to FIGS. 4A to 4E. FIGS. 4A to 4E are schematic cross-sectional views of a method of manufacturing a circuit board assembly at various process stages according to other embodiments of the present disclosure. It is noted that the process of the method of forming the core layer in this embodiment is the same as that in FIGS. 2A to 2H, so FIGS. 4A to 4E are mainly described for differences between this embodiment and the previous embodiment.

Figure 4A:
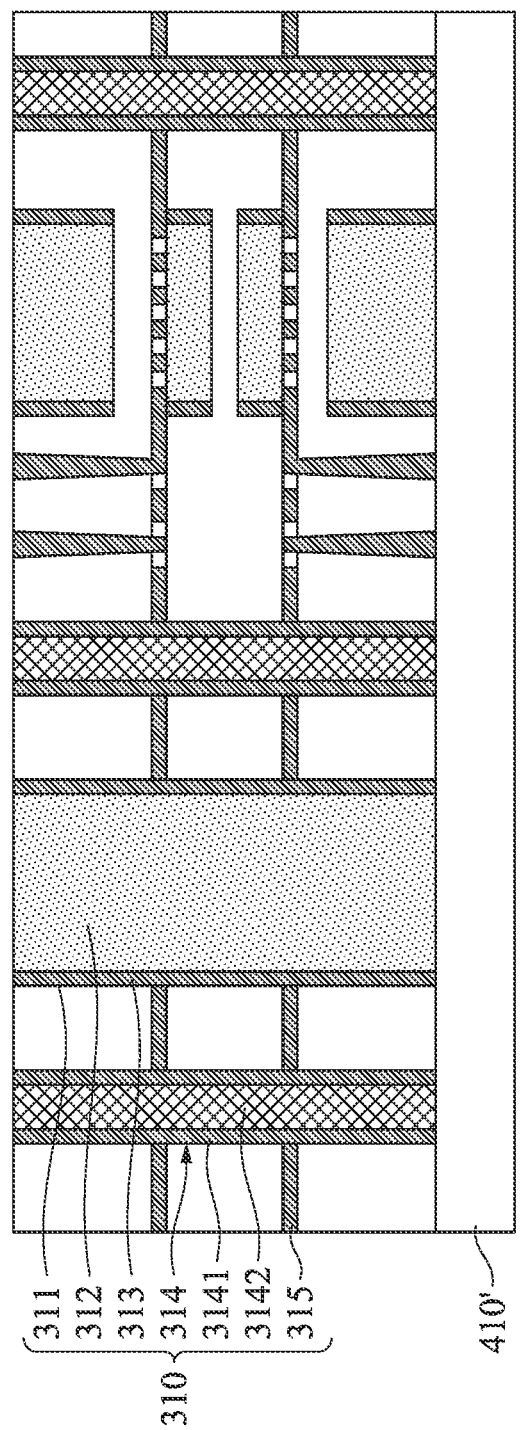

Please refer to FIG. 4A first. As shown in FIG. 4A, it is the same as that shown in FIG. 2H, that is, the core layer 310 is formed over the second substrate 410'. Firstly, the difference between the circuit board assembly 300 shown in FIG. 3A and the circuit board assembly 100 shown in FIG. 1A is that the height of the second shielding ring wall 314 in the circuit board assembly 300 is greater than the total thickness of all the electronic components 312, and all the electronic components 312 are not in contact with upper and lower surfaces of the core layer 310. Different from the previous embodiment, the first shielding column 341 and the second shielding column 361 are electrically connected to the second shielding ring wall 314.

Figure 4B:
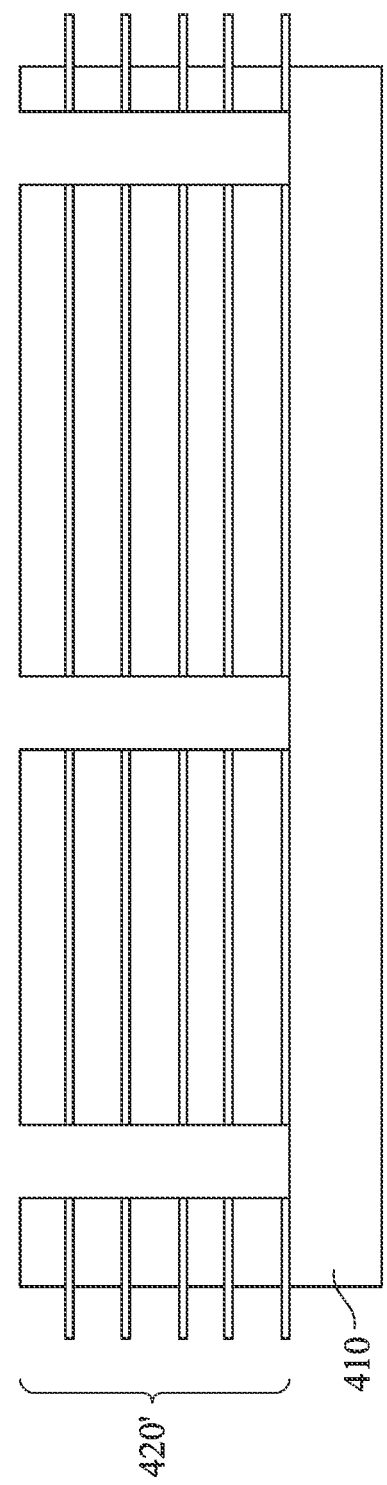

Please refer to FIG. 4B, a composite dielectric pattern layer 420' is formed over the third substrate 410. The composite dielectric pattern layer 420' exposes a portion of the third substrate 410, and the composite dielectric pattern layer 420' has a plurality of recesses 423. In some embodiments, before the composite dielectric pattern layer 420' is formed, as in the step shown in FIG. 2B, the composite dielectric pattern layer 420' has been pre-cured, so that a flat sidewall can be formed by using a patterning process. After the patterning process is performed, a portion of an upper surface of the third substrate 410 is exposed, and a plurality of recesses 423 are surrounded by the portion of the upper surface and sidewalls of the composite dielectric pattern layer 420'. The formed composite dielectric pattern layer 420' is used to cover the core layer 310 in FIG. 4A and to extend the second shielding ring wall 314.

Referring to FIG. 4C, a plurality of patterned metal layers 430' are formed on the composite dielectric pattern layer 420'. The patterned metal layer 430' exposes a portion of an upper surface of the composite dielectric pattern layer 420' and covers sidewalls of the recesses 423. The method of forming the patterned metal layer 430' is the same as the steps shown in FIGS. 2C to 2E, so it will not be repeated here.

Figure 4D:
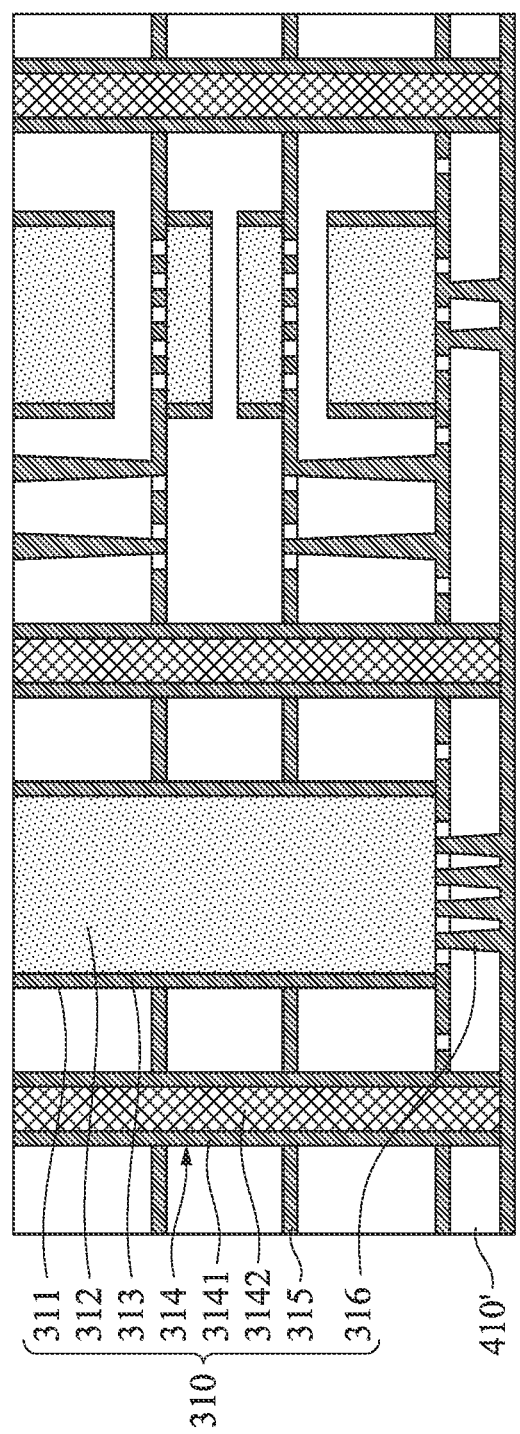

Referring to FIG. 4D, the composite dielectric pattern layer 420' is peeled layer by layer and adhered to upper and lower surfaces of the core layer 310 to increase a thickness of the core layer 310. Specifically, the peeled composite dielectric pattern layer 420' will form a plurality of dielectric pattern layers, and each of the dielectric pattern layers has a plurality of openings. The steps and features are similar to those of the aforementioned FIGS. 2G and 2H and not depicted. It is noted that, in this step, the opening of each of the dielectric pattern layers is formed corresponding to the second shielding ring wall 314 of the core layer 310, and no opening is disposed corresponding to the accommodating space 311.

Next, please continue to refer to FIG. 4D, after the dielectric pattern layer is adhered to the upper and lower surfaces of the core layer 310, a conductive material 3142 fills the opening extending in the second shielding ring wall 314. A plurality of conductive columns 316 are formed, and the conductive columns 316 can be electrically connected to different electronic components 312. The method of forming the conductive column 316 may include a drilling process and a deposition process. So far, the second shielding ring wall 314 extends to the upper and lower surfaces of the core layer 310, and the electronic components 312 are not in contact with the upper and lower surfaces of the core layer 310. In other words, the height of the second shielding ring wall 314 is greater than the total thickness of all the electronic components 312.

Figure 4E:
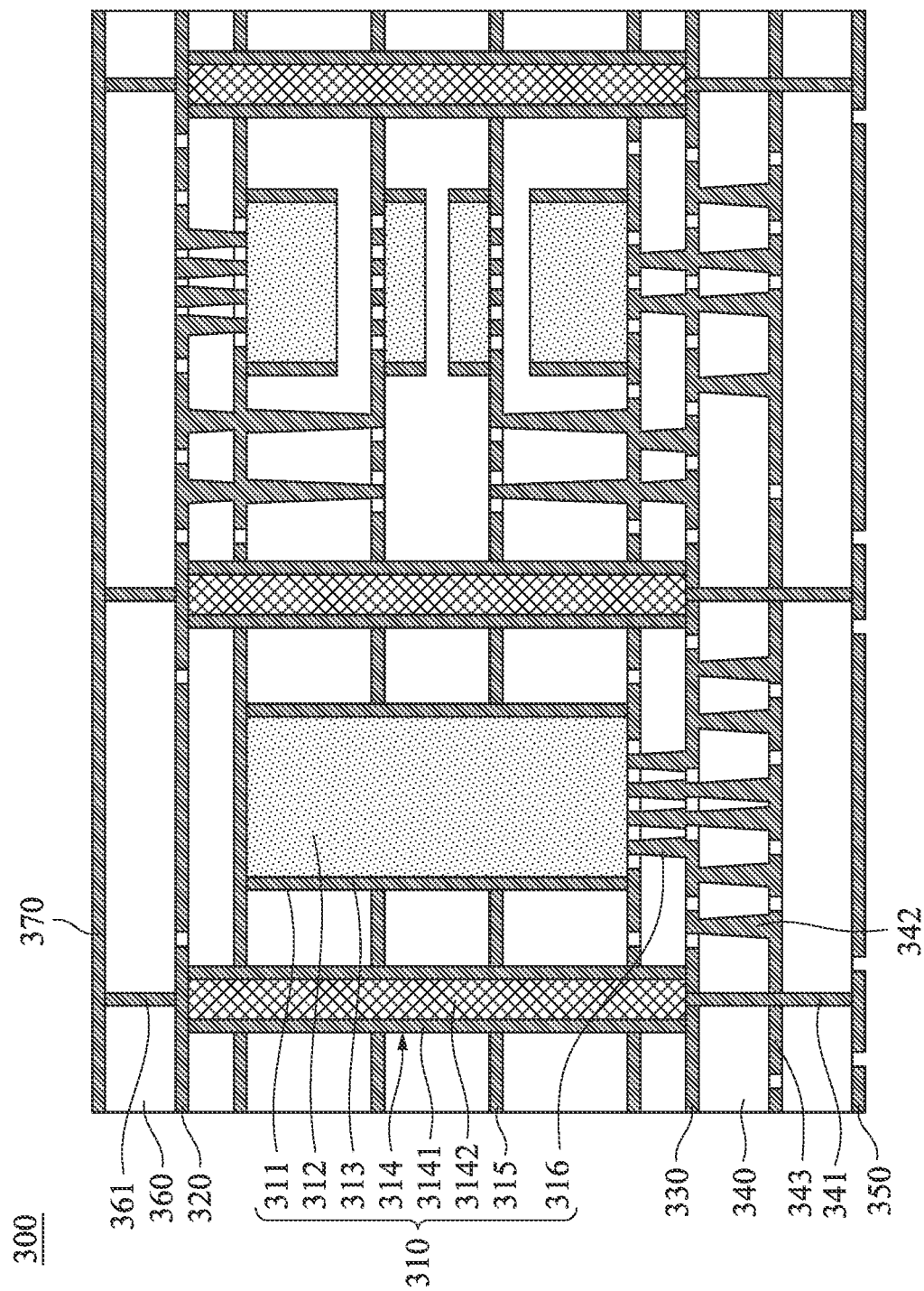

Referring to FIG. 4E, a first circuit layer 320 and a second circuit layer 330 are formed, and the core layer 310 is located between the first circuit layer 320 and the second circuit layer 330. Next, a first insulating layer 340 is formed on the second circuit layer 330, and a second insulating layer 360 is formed on the first circuit layer 320. In some embodiments, the method of forming the first circuit layer 320, the second circuit layer 330, the first insulating layer 340, and the second insulating layer 360 may include a deposition process.

The present disclosure also relates to the formation of a plurality of first shielding columns 341 in the first insulating layer 340, and the first shielding columns 341 are electrically connected to the second shielding ring wall 314. In some embodiments, the method of forming the first shielding column 341 may include a drilling process and a deposition process, and a plurality of second shielding columns 361 are formed in the second insulating layer 360. The second shielding columns 361 are also electrically connected to the second shielding ring wall 314. In some embodiments, the method of forming the second shielding column 361 may include a drilling process and a deposition process.

A plurality of conductive columns 342 are formed in the first insulating layer 340, and the conductive columns 342 are electrically connected to the core layer 310. In one embodiment, the method of forming the conductive columns 342 may include a drilling process and a deposition process. A first shielding layer 350 is formed on the first insulating layer 340, and a second shielding layer 370 is formed on the second insulating layer 360. The method of forming the first shielding layer 350 and the second shielding layer 370 may include a deposition process, electroplating, or a combination thereof. As such, the circuit board assembly 300 shown in FIG. 3A of the present disclosure is formed, which can completely shield the electromagnetic waves emitted from electronic component.

In summary, the circuit board assembly of the present disclosure is provided with the first shielding ring wall around each of the electronic components, which preliminarily shields the electromagnetic waves. In addition, the second shielding ring wall is used to shield the electromagnetic waves leaking from the electronic component. Moreover, the first shielding column and/or the second shielding column are used to shield the electromagnetic field generated by the conductive column. In addition, the shielding layer is provided to enhance the overall shielding effect. Accordingly, the present disclosure can effectively avoid the electromagnetic interference between the electronic components.

The foregoing outlines features of several embodiments so that those skilled in the art may better understand various aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit board assembly, comprising:
    a core layer having at least one accommodating space, wherein the at least one accommodating space has an inner side wall;
    at least one electronic component disposed in the at least one accommodating space;
    at least one first shielding ring wall disposed in the at least one accommodating space and covering the inner side wall, wherein the at least one first shielding ring wall surrounds the at least one electronic component;
    at least one second shielding ring wall disposed in the core layer and surrounding the at least one first shielding ring wall;
    a first circuit layer;
    a second circuit layer, wherein the core layer is disposed between the first circuit layer and the second circuit layer;
    a first insulating layer, wherein the second circuit layer is disposed between the first insulating layer and the core layer;
    a plurality of first shielding columns disposed in the first insulating layer; and
    a shielding layer, wherein the shielding layer is disposed beneath the first insulating layer, and the first insulating layer is disposed between the shielding layer and the core layer, and the first shielding columns extend to the core layer and the shielding layer.

2. The circuit board assembly of claim 1, wherein the first shielding columns are electrically connected to the at least one first shielding ring wall.

3. The circuit board assembly of claim 1, further comprising:
    a second insulating layer, wherein the first circuit layer is disposed between the second insulating layer and the core layer; and
    a plurality of second shielding columns disposed in the second insulating layer, and the first shielding columns and the second shielding columns arranged along the at least one second shielding ring wall.

4. The circuit board assembly of claim 1, wherein the at least one second shielding ring wall comprises two metal layers and a conductive material, and the two metal layers are arranged in concentric rings, and one of the metal layers surrounds the other of the metal layers and the conductive material.

5. The circuit board assembly of claim 4, wherein a surface of the at least one electronic component, one end of the second shielding ring wall and a surface of the core layer are coplanar.

6. The circuit board assembly of claim 4, wherein a height of the second shielding ring wall is greater than a thickness of the at least one electronic component.

7. The circuit board assembly of claim 4, wherein a material of the core layer is a non-photosensitive dielectric material.

8. The circuit board assembly of claim 1, wherein the at least one electronic component is electrically isolated from the at least one first shielding ring wall, the at least one second shielding ring wall, and the first shielding columns.

9. A method of manufacturing a circuit board assembly, comprising:
    providing a first substrate;
    forming a composite dielectric layer over the first substrate, and the composite dielectric layer comprising a plurality of sub-dielectric layers and a plurality of release films, wherein each of the release films is disposed between adjacent two of the sub-dielectric layers;
    patterning the composite dielectric layer to form a composite dielectric pattern layer, wherein the composite dielectric pattern layer exposes a portion of the first substrate, and the composite dielectric pattern layer has a plurality of recesses;
    forming a plurality of metal layers on the composite dielectric pattern layer, wherein the metal layers cover an upper surface of the composite dielectric pattern layer and a plurality of sidewalls of the recesses;
    separating the composite dielectric pattern layer to form a plurality of dielectric pattern layers, wherein each of the dielectric pattern layers has a plurality of openings;
    stacking the dielectric pattern layers over a second substrate to form a core layer over the second substrate, wherein the openings of the dielectric pattern layers form a plurality of accommodating spaces and at least one groove;
    disposing at least one electronic component in at least one of the accommodating spaces;

removing the second substrate after disposing the at least one electronic component in the at least one of the accommodating spaces;

forming at least one circuit layer on the core layer;

forming at least one insulating layer on the at least one circuit layer; and forming a plurality of shielding columns in the at least one insulating layer.

10. The method of claim 9, further comprising:

during disposing the at least one electronic component in the accommodating space, filling at least one conductive material in the groove, wherein the at least one conductive material protrudes from the groove.

11. The method of claim 9, further comprising:

after separating the composite dielectric pattern layer and before stacking the dielectric pattern layers over the second substrate, forming a plurality of metal layers on the dielectric pattern layers.

12. The method of claim 9, wherein patterning the composite dielectric layer comprises:

alternately stacking the sub-dielectric layers and the release films; and curing the sub-dielectric layers.

13. The method of claim 9, wherein patterning the composite dielectric layer comprises an etching process, an imprinting process, a cutting process, or a combination thereof.

14. The method of claim 9, wherein during stacking the dielectric pattern layers over the second substrate, the dielectric pattern layers are adhered to each other.

15. The method of claim 9, wherein during stacking the dielectric pattern layers over the second substrate, the dielectric pattern layers and the second substrate are in a working environment with a temperature in a range from 25° C. to 180° C.

* * * * *